(12) United States Patent
Wang et al.

(10) Patent No.: US 10,823,773 B2
(45) Date of Patent: Nov. 3, 2020

(54) IMPEDANCE DETECTION APPARATUS FOR EARPHONE PLUG

(71) Applicant: GOERTEK INC., Weifang (CN)

(72) Inventors: Jianbo Wang, Weifang (CN); Xinfang Cao, Weifang (CN); Yongjiang Lu, Weifang (CN)

(73) Assignee: GOERTEK INC., Weifang (CN)

( * ) Notice: Subject to any disclaimer, the term of this patent is extended or adjusted under 35 U.S.C. 154(b) by 199 days.

(21) Appl. No.: 16/304,597

(22) PCT Filed: Dec. 16, 2016

(86) PCT No.: PCT/CN2016/110300
§ 371 (c)(1),
(2) Date: Nov. 26, 2018

(87) PCT Pub. No.: WO2017/206482
PCT Pub. Date: Dec. 7, 2017

(65) Prior Publication Data
US 2019/0293700 A1    Sep. 26, 2019

(30) Foreign Application Priority Data

May 30, 2016   (CN) .......................... 2016 1 0374081

(51) Int. Cl.
*H04R 1/10*   (2006.01)
*H04R 3/00*   (2006.01)
(Continued)

(52) U.S. Cl.
CPC ............. *G01R 27/02* (2013.01); *H01R 24/58* (2013.01); *H04R 1/10* (2013.01); *H04R 3/007* (2013.01)

(58) Field of Classification Search
CPC .... H04R 2499/11; H04R 5/04; H04R 1/1041; H04R 5/033
See application file for complete search history.

(56) References Cited

U.S. PATENT DOCUMENTS

| 9,927,383 B2 * | 3/2018 | Roh ........................ G01L 21/30 |
| 2015/0208159 A1 * | 7/2015 | Sander .................... H04R 3/00 381/74 |

(Continued)

FOREIGN PATENT DOCUMENTS

| CN | 202634659 U | * 12/2012 |
| CN | 202634659 U |   12/2012 |

(Continued)

*Primary Examiner* — Alesa Allgood
(74) *Attorney, Agent, or Firm* — Saliwanchik, Lloyd & Eisenschenk

(57) ABSTRACT

An impedance detection apparatus for an earphone plug, including: an earphone jack unit; a voltage sampling unit comprising a first resistor connected between a positive terminal of a power supply and a contact access point, a negative terminal of the power supply being in contact with the jack end ground wire contact; a contact selection unit comprising selection switches arranged in one-to-one correspondence with selected jack end connection contacts, each of the selection switches being connected between a corresponding connection contact and the contact access point; a processing unit configured to calculate an impedance value of an equivalent impedance between the selected connection contact and the jack end ground wire contact according to the voltage of the contact access point with respect to the jack end ground wire contact; and a display unit.

11 Claims, 3 Drawing Sheets

(51) Int. Cl.
    *H04R 5/04*     (2006.01)
    *G01R 27/02*     (2006.01)
    *H01R 24/58*     (2011.01)

(56) References Cited

U.S. PATENT DOCUMENTS

| | | | |
|---|---|---|---|
| 2015/0377810 A1* | 12/2015 | Roh | G01N 27/048 324/694 |
| 2016/0127828 A1* | 5/2016 | Maher | H04R 5/04 381/94.1 |

FOREIGN PATENT DOCUMENTS

| | | |
|---|---|---|
| CN | 203490285 U | 3/2014 |
| CN | 103986999 A | 8/2014 |
| CN | 105425044 A | 3/2016 |
| CN | 106093574 A | 11/2016 |
| JP | 2010226329 A | 10/2010 |

\* cited by examiner

IMPEDANCE DETECTION APPARATUS FOR EARPHONE PLUG

CROSS REFERENCE TO RELATED APPLICATIONS

This application is a National Stage of International Application No. PCT/CN2016/110300, filed on Dec. 16, 2016, which claims priority to Chinese Patent Application No. 201610374081.0, filed on May 30, 2016, both of which are hereby incorporated by reference in their entireties.

FIELD OF THE INVENTION

The present invention relates to the technical field of impedance detection, and more particularly, to an impedance detection apparatus for an earphone plug.

BACKGROUND OF THE INVENTION

An existing earphone plug mainly has a 3.5 mm earphone plug, a USB plug, etc. The USB plug can be further divided into various types such as USB 2.0, USB 3.0, mini USB, Type-C and the like. As an earphone plug will be corroded by sweat when an earphone is in use, the earphone needs to go through a sweat test in the development phase, so as to determine the corrosion resistance of the earphone plug by detecting an equivalent impedance between contacts of the earphone plug and a ground wire contact in subsequent reliability analysis. Then, a conclusion as whether the product is reliable can be obtained. That is, if an equivalent impedance between a certain contact and the ground wire contact is beyond a set standard range, it indicates that the corresponding contact and the ground wire contact have been corroded therebetween, then coming to a conclusion that the product is not reliable.

At present, the above-mentioned equivalent impedance is mainly measured by an operator using a multimeter. Because of a large number of products to be tested, it is not only inefficient to rely on manual operation during analysis, but also causes large measurement errors due to improper operations, thus affecting the accuracy of the conclusion.

SUMMARY OF THE INVENTION

An object of an embodiment of the present invention is to provide an impedance detection apparatus capable of quickly and accurately detecting an equivalent impedance between a ground wire contact and other contacts of an earphone plug.

According to a first aspect of the present invention, there is provided an impedance detection apparatus for an earphone plug, comprising: an earphone jack unit comprising at least one type of earphone jacks each of which has a jack end ground wire contact configured for connection to a ground wire contact of a corresponding earphone plug and jack end connection contacts configured for corresponding connection to other contacts of the corresponding earphone plug; a voltage sampling unit comprising a first resistor connected between a positive terminal of a power supply and a contact access point, a negative terminal of the power supply being in connection with the jack end ground wire contact; a contact selection unit comprising selection switches arranged in one-to-one correspondence with the selected jack end connection contacts, each of the selection switches being connected between the corresponding connection contact and the contact access point; a processing unit configured to calculate an impedance value of an equivalent impedance between the selected connection contact and the jack end ground wire contact according to a voltage of the contact access point with respect to the jack end ground wire contact; and a display unit configured to display the impedance value calculated by the processing unit.

Alternatively, the voltage sampling unit further comprises an in-phase proportional amplifier circuit, the contact access point is connected to a voltage input terminal of the in-phase proportional amplifier circuit, and an output terminal of the in-phase proportional amplifier circuit is connected to a voltage input terminal of the processing unit.

Alternatively, each of the selection switches is a relay contact, and the apparatus is configured to control a switching state of the relay contact by the processing unit.

Alternatively, the selection switches are all normally open relay contacts.

Alternatively, a normally closed relay contact corresponding to each normally open relay contact is connected between the corresponding connection contact and the jack end ground wire contact.

Alternatively, the first resistor is formed by connecting two bridge arm resistors having the same resistance in parallel, the voltage sampling unit further comprises a second resistor, the second resistor is connected between the contact access point and the jack end ground wire contact, and the resistance of the second resistor is the same as the resistance of the bridge arm resistor.

Alternatively, the display unit comprises a latch and digital tubes, and an IO pin of the processing unit for outputting a segment code control signal is connected to a corresponding segment code pin of the corresponding digital tube via the latch.

Alternatively, the display unit is a display unit of two or more bits, and the display unit adopts a dynamic display structure, wherein the same segment code pins of all the digital tubes are connected together, and an TO pin of the processing unit for outputting a bit gating signal is connected to a gating pin of the corresponding digital tube.

Alternatively, the processing unit is further configured to determine whether the calculated impedance value is within a corresponding standard range and output a determination result signal, wherein if yes, then the determination result signal is a normal signal indicating a normal impedance value, and if no, then the determination result signal is an abnormal signal indicating an abnormal impedance value; and the apparatus further comprises a prompting unit configured to prompt the abnormal impedance value according to at least the abnormal signal.

Alternatively, the earphone jack unit comprises a 3.5 mm earphone jack corresponding to a 3.5 mm earphone plug and a USB earphone jack corresponding to a USB earphone plug.

The inventors of the present invention have found that in the prior art, equivalent impedance detection of an earphone plug has problems of low efficiency and low accuracy. Therefore, the technical task to be solved by the present invention or the technical problem to be solved is never imagined or unexpected by those skilled in the art, so the present invention is a new technical solution.

It is an advantageous effect of the present invention that the impedance detection apparatus of the present invention can detect an impedance value of an equivalent impedance between a ground wire contact and other selected contact of an earphone plug when inserting the earphone plug into a corresponding earphone jack. This can not only eliminate measurement errors introduced by improper operations, and thus ensure the measurement accuracy, but also greatly improve the detection efficiency, which is conducive to batch detection.

Further features of the present invention, as well as advantages thereof, will become apparent from the following detailed description of exemplary embodiments of the present invention with reference to the attached drawings.

BRIEF DESCRIPTION OF THE DRAWINGS

The accompanying drawings, which are incorporated in and constitute a part of the specification, illustrate embodiments of the present invention and, together with the description, serve to explain the principles of the present invention.

DESCRIPTION OF REFERENCE NUMERALS

101: earphone jack unit, 102: contact selection unit;
103: voltage sampling unit, 104: processing unit;
105: display unit, J1: 3.5 mm earphone jack;
L, R, MIC: jack end connection contact; GND: jack end ground wire contact;
LS1: first selection switch; LS2: second selection switch;
LS3: third selection switch; R1: first resistor;
R2: second resistor; R101, R102: bridge arm resistor;
IN: contact access point; OUT: output terminal of in-phase proportional amplifier circuit;
BT: power supply; U3: operational amplifier;
R7-R8, R10-R12—resistor; P1.0—voltage input terminal;
DVCC—power pin for processing unit; P1.0~P1.7: IO pin for processing unit;
DVSS—ground pin for processing unit; P2.0~P2.5: IO pin for processing unit;
LVCC: power pin for latch; LGND: ground pin for latch;
D0~D7: input pin for latch; Q0~Q7: output pin for latch;
DS1: first digital tube; DS2: second digital tube;
a~g, DP: segment code pin for digital tube; DGND: ground pin for digital tube;
SL: gating pin for digital tube.

DETAILED DESCRIPTION OF THE EMBODIMENTS

Various exemplary embodiments of the present invention will now be described in detail with reference to the accompanying drawings. It should be noted that the relative arrangement of the components and steps, numerical expressions and numerical values set forth in these embodiments do not limit the scope of the present invention unless it is specifically stated otherwise.

The following description of at least one exemplary embodiment is merely illustrative in nature and by no means is to be construed as any limitation on the invention and its application or use.

Techniques, methods, and apparatuses known to one of ordinary skill in the relevant art may not be discussed in detail but, where appropriate, the techniques, methods, and apparatuses should be considered part of the description.

In all of the examples shown and discussed herein, any specific value should be interpreted as merely illustrative and not as a limitation. Therefore, other examples of the exemplary embodiments may have different values.

It should be noted that like reference numbers and letters designate similar terms in the following figures, and therefore, an item need not be further discussed in subsequent figures as soon as an item is defined in a drawing.

In order to solve the problems of low efficiency and low accuracy in impedance detection of an existing earphone plug, the present invention provides an impedance detection apparatus for an earphone plug.

Figure 1:
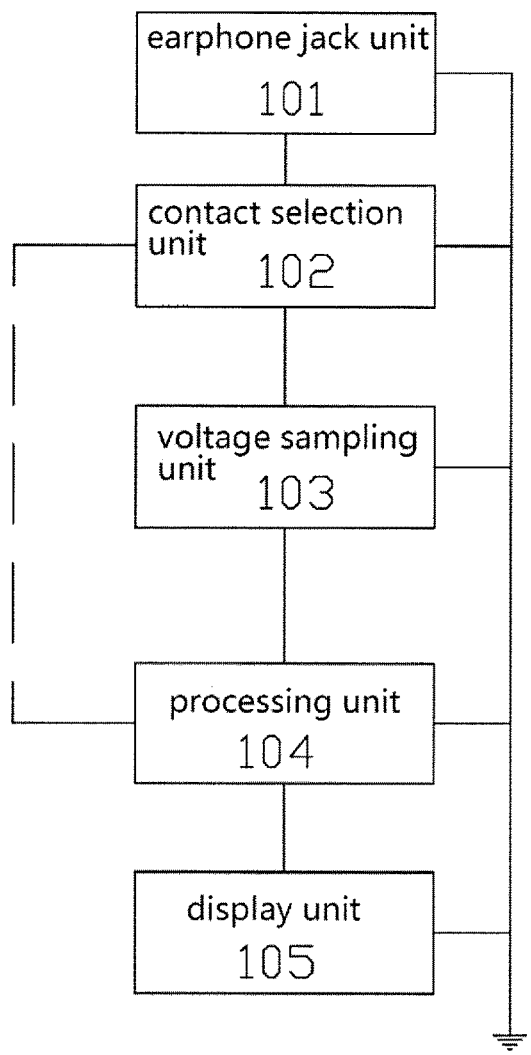
FIG. 1 is a block diagram of an implementation of an impedance detection apparatus in accordance with the present invention.

FIG. 1 is a block diagram of an implementation of an impedance detection apparatus in accordance with the present invention. The dotted lines in the figure indicate that a contact selection unit 102 may be a manual operation selection unit not controlled by a processing unit 104, or may be an automatic selection unit controlled by the processing unit 104.

As shown in FIG. 1, the apparatus of the present invention comprises an earphone jack unit 101, a voltage sampling unit 103, a contact selection unit 102, a processing unit 104 and a display unit 105.

The earphone jack unit 101 is configured to connect an earphone plug to the apparatus of the present invention for impedance value measurement.

The contact selection unit 102 is configured to select a contact of the earphone plug that is currently connected to a detection circuit.

The voltage sampling unit 103 is configured to collect a voltage signal that reflects the impedance value of the equivalent impedance and output the voltage signal to the processing unit 104 to calculate the impedance value.

The display unit 105 is configured to display the impedance value calculated by the processing unit 104.

The earphone jack unit 101 includes at least one type of earphone jacks each of which has a jack end ground wire contact for connection to a ground wire contact of a corresponding earphone plug and a jack end connection contact for connection to other contacts of the corresponding earphone plug. In this way, since the contacts of the earphone jack are connected to the detection circuit of the apparatus, when the earphone plug is inserted into a corresponding earphone jack, the corresponding contact of the earphone plug is connected to the detection circuit to detect the equivalent impedance between the ground wire contact of the earphone plug and the other selected contacts of the earphone plug.

The earphone jack unit 101 may include one type of earphone jacks, such as a 3.5 mm earphone jack or a USB earphone jack, and the like. The USB earphone jack may be a mini USB jack, a Type-C interface jack, etc. which is applied to an earphone interface. In order to expand the scope of application of the apparatus of the present invention to different earphone plugs, the earphone jack unit 101 may further include at least two types of earphone jacks, for example, a 3.5 mm earphone jack corresponding to a 3.5 mm earphone plug and a USB earphone jack corresponding to at least one type of USB earphone plugs.

Figure 5:
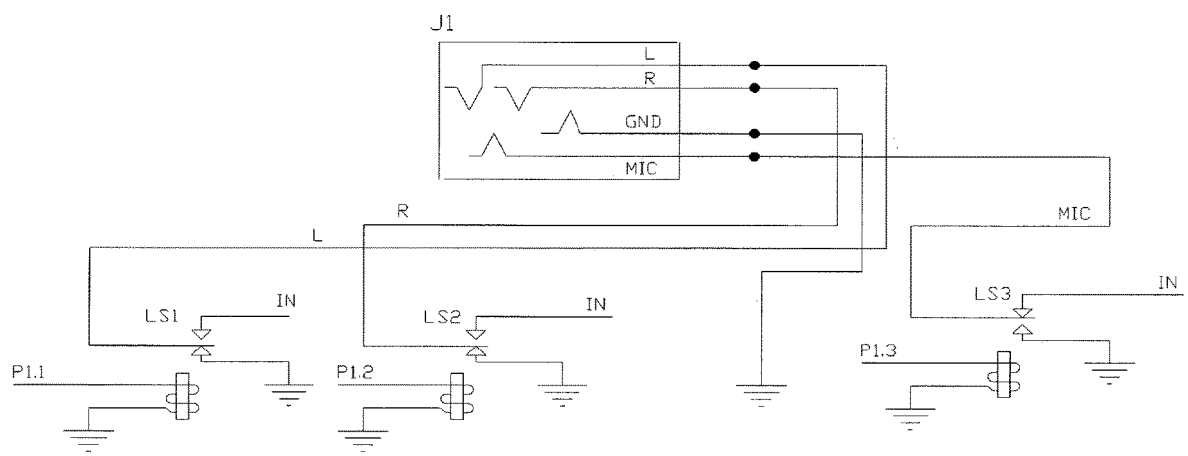
FIG. 5 is a circuit diagram of an implementation of a contact selection unit in FIG. 1.

FIG. 5 shows a structure diagram of a 3.5 mm earphone jack J1 corresponding to a 3.5 mm earphone plug. The following takes a 3.5 mm earphone interface as an example to illustrate the correspondence between a 3.5 mm earphone plug and a 3.5 mm earphone jack J1. Because the 3.5 mm earphone plug has four contacts, namely a ground wire contact, a left ear cable contact, a right ear cable contact and a microphone cable contact, the earphone jack J1 should also include four contacts, namely a jack end ground wire contact GND for connection to the ground wire contact, a jack end connection contact L for connection to the left ear cable contact, a jack end connection contact R for connection to the right ear cable contact, and a jack end connection contact MIC for connection to the microphone cable contact. The connections among the corresponding contacts are specifically contact-type electrical connections.

The contact selection unit 102 includes selection switches arranged in one-to-one correspondence with the selected jack end connection contacts. Each of the selection switches is connected between the corresponding connection contact and the contact access point so that when the selection switch is closed, the corresponding connection contact is connected with the contact access point, and then the equivalent impedance between the corresponding connection contact and the jack end ground wire contact is connected to the detection circuit of the apparatus of the present invention. The selection may be selection of all the jack end connection contacts, that is, selection of all the contacts of the earphone plug for impedance detection, or may be selection of some jack end connection contacts as required, that is, selection of some contacts of the earphone plug for impedance detection.

FIG. 5 shows a contact selection unit for a 3.5 mm earphone jack. Now, taking the 3.5 mm earphone jack as an example, the structure of the contact selection unit will be described. As shown in FIG. 5, the contact selection unit includes a first selection switch LS1, a second selection switch LS2, and a third selection switch LS3. The first selection switch LS1 is connected between the jack end connection contact L and the contact access point IN. The second selection switch LS2 is connected between the jack end connection contact R and the contact access point IN. The third selection switch is connected the between the jack end connection contact MIC and the contact access point IN.

The above selection switch may be a manual operation switch, that is, an operator manually selects a contact for current detection, or may be a controlled switch to automatically perform the impedance detection of each contact in sequence after the apparatus is powered on.

For a controlled switch, the selection switches LS1, LS2 and LS3 in FIG. 5 employ relay contacts whose switching states can be controlled by the processing unit 104, i.e., the energization states of the coils of these relay contacts are controlled by the processing unit 104. In the embodiment shown in FIG. 5, the processing unit 104 controls the switching state of the selection switch LS1 via the pin P1.1 (see FIG. 6), controls the switching state of the selection switch LS2 via the pin P1.2 (see FIG. 6), and controls the switching state of the selection switch LS3 via the pin P1.3 (see FIG. 6). The states shown in FIG. 5 are that the selection switch LS3 is closed and the selection switches LS1 and LS2 are opened to achieve the connection between the jack end connection contact MIC and the contact access point IN, and then detect the equivalent impedance between the jack end connection contact MIC and the jack end ground wire contact GND.

The above selection switch preferably adopts a normally open relay contact so that after a contact is selected, the coils of the relay corresponding to other contacts are in a power loss state, thereby achieving the purpose of saving energy. On this basis, in order to reduce interference, as shown in FIG. 5, a normally closed relay contact corresponding to each normally open relay contact may also be connected between the corresponding connection contact and the jack end ground wire contact to ground the unselected jack end connection contacts.

For a controlled switch, the above-mentioned selection switch can also adopt an analog switch, such as a single-pole double-throw analog switch, so as to achieve a structural design of being in contact with the contact access point when it is selected and being in contact with the jack end connection contact when it is not selected.

Figure 2:
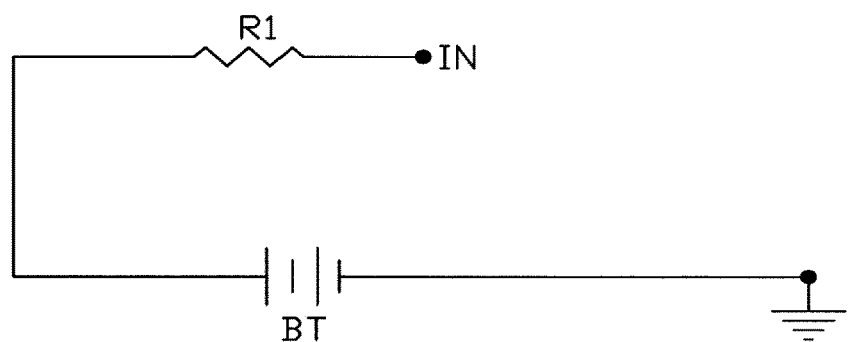
FIG. 2 is a circuit diagram of an implementation of a voltage sampling circuit in FIG. 1.

FIG. 2 is a basic structure of the voltage sampling unit in FIG. 1. As shown in FIG. 2, the voltage sampling unit 103 may include a first resistor R1 connected between a positive terminal of a power supply BT and the contact access point IN, and the negative terminal of the power supply is connected to the jack end ground wire contact GND. After a jack end connection contact is connected to the contact access point IN through the contact selection unit 102, the equivalent impedance between the selected connection contact and the jack end ground wire contact GND is connected between the contact access point IN and the jack end connection contact GND, thus forming a detection circuit. Therefore, the impedance value of the equivalent impedance can be calculated by obtaining the voltage of the contact access point IN with respect to the jack end ground wire contact GND.

Figure 3:
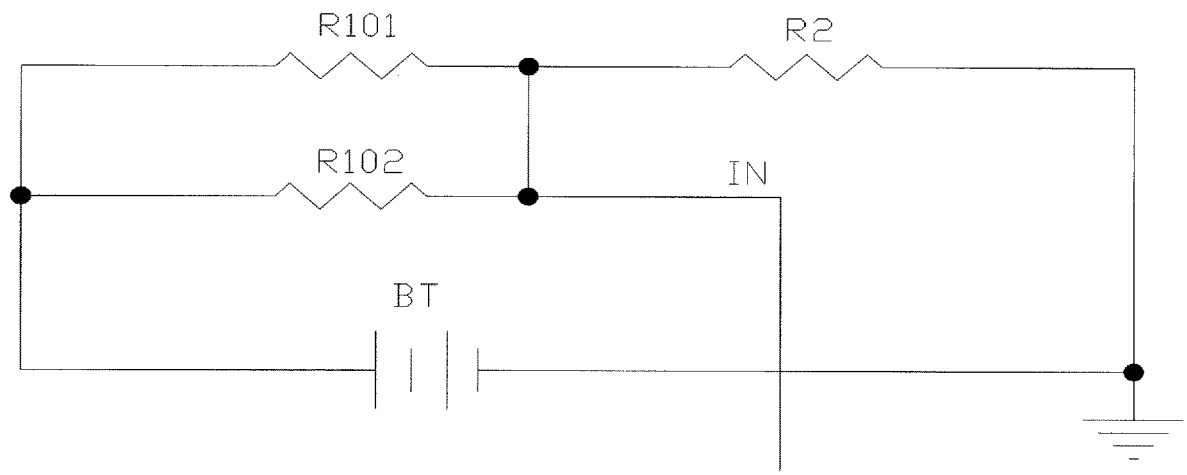
FIG. 3 is a circuit diagram of another implementation of the voltage sampling circuit in FIG. 1.

In order to improve the detection accuracy and reduce the impact of connecting wires on the calculation results, FIG. 3 shows a circuit diagram of an alternative bridge voltage sampling circuit.

As shown in FIG. 3, the first resistor R1 is formed by connecting two bridge arm resistors R101 and R102 having the same resistance in parallel. The voltage sampling unit 103 further includes a second resistor R2 connected between the contact access point IN and the jack end ground wire contact GND, which is equivalent to be connected to the equivalent impedance in parallel. The resistance of the second resistor R2 is the same as the resistance of the bridge arm resistors R101, R102 to form a Wheaton bridge.

The voltage sampling unit 103 may further include an amplifier circuit as required. A voltage input terminal of the amplifier circuit is connected to the contact access point IN. An output terminal of the amplifier circuit is connected to a voltage input terminal of the processing unit 104 for supplying the amplified voltage to the processing unit 104, thereby increasing the sensitivity.

Figure 4:
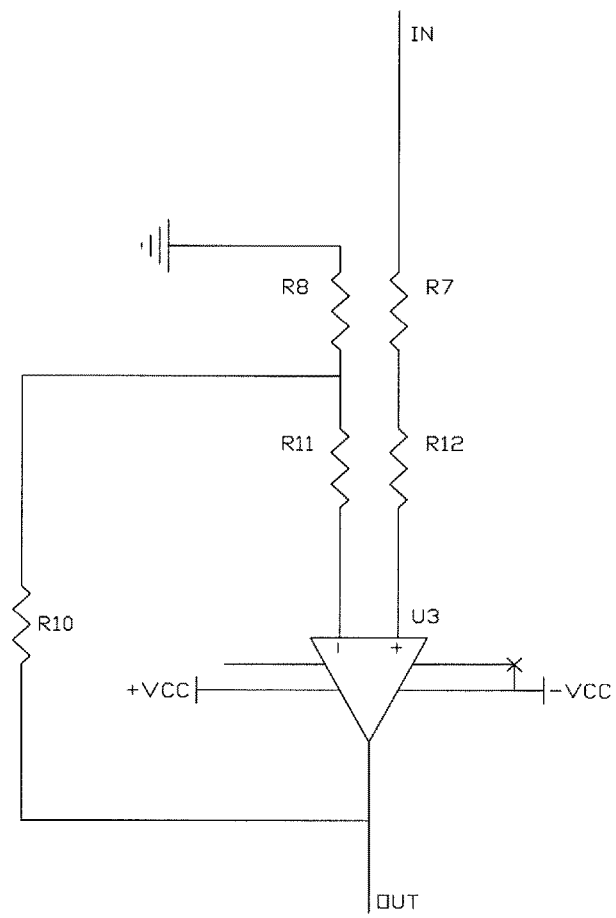
FIG. 4 is a circuit diagram of a third implementation of the voltage sampling circuit in FIG. 1.

FIG. 4 shows a circuit diagram of an implementation of an in-phase proportional amplifier circuit.

As shown in FIG. 4, the in-phase proportional amplifier circuit includes an operational amplifier U3, and resistors R7, R8, R10, R11 and R12. The resistor R8 is connected in series with the resistor R11 and between the jack end ground wire contact GND and an inverted-phase input terminal of the operational amplifier U3. One end of the resistor R10 is connected to a potential point between the resistor R8 and the resistor R11, and the other end thereof is connected to an output terminal OUT of the operational amplifier U3 to form a feedback resistor. The resistor R7 and the resistor R12 are connected in series between an in-phase input terminal and a voltage input terminal of the operational amplifier U3. The voltage input terminal is connected to the contact access point IN for performing in-phase proportional amplification on the voltage at the contact access point. The amplified voltage signal is input to the processing unit 104 for processing. For example, the output terminal OUT is connected to the pin P1.0 of the processing unit 104 (see FIG. 6). The processing unit 104 should have an analog-to-digital converter built therein, in order to achieve analog-to-digital conversion.

The processing unit 104 is configured to calculate an impedance value of an equivalent impedance between the selected connection contact and the jack end ground wire contact GND according to the voltage of the contact access point IN with respect to the jack end ground wire contact GND.

The processing unit 104 may also determine whether the calculated impedance value is within a corresponding standard range according to pre-stored normal ranges of equivalent impedances corresponding to different connection contacts and output a determination result signal. If yes, then the determination result signal is a normal signal indicating a normal resistance, and if no, then the determination result signal is an abnormal signal indicating an abnormal resistance. For this reason, the apparatus of the present invention may further include a prompting unit (not shown in the figures) configured to prompt the abnormal resistance at least according to the abnormal signal. The prompting unit may include at least one of acoustic, light, and display prompting circuits or any combination thereof.

The display unit 105 may be a digital tube display circuit or a liquid crystal display circuit. If a liquid crystal display circuit is used, the prompting unit may be the same unit as the display unit, that is, the prompt operation may be implemented simultaneously by the display unit.

Figure 6:
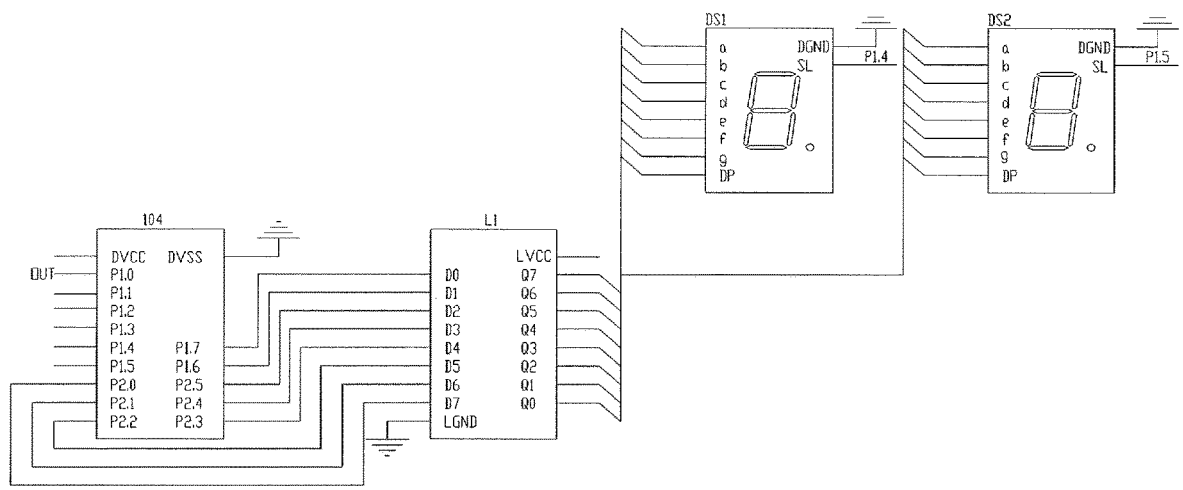
FIG. 6 is a circuit diagram of an implementation structure of a display unit in FIG. 1.

FIG. 6 shows a circuit diagram of an alternative implementation of a digital tube display circuit.

The digital tube display circuit includes a latch L1 and two digital tubes. The two digital tubes are a first digital tube DS1 and a second digital tube DS2, respectively. An IO pin P1.0 of the processing unit 104 functions as a voltage input terminal to be connected to the contact access point IN or the output terminal of the amplifier circuit. An IO pin of the processing unit 104 for outputting a segment code control signal is connected to a corresponding segment code pin (including a point segment code pin) of a corresponding digital tube. The processing unit 104 converts the voltage received via the pin P1.0 into a segment code control signal to control the digital tube to display the corresponding voltage.

The display unit 105 may adopt a static display structure, that is, one IO pin for outputting a segment code control signal corresponds to only one segment code pin of one digital tube; or the display unit 105 may adopt a dynamic display structure, that is, the same segment code pins of two digital tubes are connected together so that one IO pin for outputting a segment code control signal corresponds to the same segment code pins of all the digital tubes. Here, since the dynamic display structure performs display in turn using the persistence effect of human eyes, the processing unit 104 also needs to control the alternate gating of the two digital tubes, which requires the IO pin of the processing unit 104 for outputting a bit gating signal to be connected to a gating pin of a corresponding digital tube. In the dynamic display structure, since a total of eight segment code control signals are required, the latch L1 preferably adopts an eight-way latch, so that only one latch needs to be configured.

FIG. 6 specifically shows a dynamic display structure. Specifically, IO pins P1.6, P1.7, P2.0~P2.5 of the processing unit 104 for outputting a segment code control signal and eight input pins D0~D7 of latch L1 are connected respectively. Eight segment bit pins a-f and DP (point segment bit) of the first digital tube DS1 is connected to the same segment pins of the second digital tube DS2 and then connected to eight output pins Q0~Q7 of the latch L1 respectively. The IO pin P1.4 of the processing unit 104 for outputting a bit gating signal is connected to the gating pin SL of the first digital tube DS1. The IO pin P1.5 of the processing unit 104 for outputting a bit gating signal is connected to the gating pin SL of the second digital tube DS2.

The above units can be supplied with a suitable voltage by the power supply BT via a voltage conversion chip. For example, when the power supply BT provides a voltage of 12V, a 12V-to-5V voltage conversion circuit provides a working voltage of 5V to the power pin DVCC of the processing unit 104 and the power pin LVCC of the latch L1 and provides a working voltage VCC of 12V for the amplifier circuit. The ground pin DVSS of the processing unit 104 and the ground pin LGND of the latch L1 are connected to the negative terminal of the power supply, that is, the jack end ground wire contact GND.

The above embodiments mainly focus on the differences from other embodiments, though those skilled in the art should understand that the above embodiments may be used separately or in combination with one another as needed.

Although some specific embodiments of the present invention have been described in detail by way of example, those skilled in the art should understand that the above examples are only for the purpose of illustration and are not intended to limit the scope of the present invention. It will be understood by those skilled in the art that the above embodiments may be modified without departing from the scope and spirit of the invention. The scope of the invention is defined by the appended claims.

What is claimed is:

1. An impedance detection apparatus for an earphone plug, comprising:
   an earphone jack unit comprising at least one type of earphone jacks each of which has a jack end ground wire contact configured for connection to a ground wire contact of a corresponding earphone plug and jack end connection contacts configured for corresponding connection to other contacts of the corresponding earphone plug;
   a voltage sampling unit comprising a first resistor connected between a positive terminal of a power supply and a contact access point, a negative terminal of the power supply being in connection with the jack end ground wire contact;
   a contact selection unit comprising selection switches arranged in one-to-one correspondence with the selected jack end connection contacts, each of the selection switches being connected between the corresponding connection contact and the contact access point;
   a processing unit configured to calculate an impedance value of an equivalent impedance between the selected connection contact and the jack end ground wire contact according to a voltage of the contact access point with respect to the jack end ground wire contact; and
   a display unit configured to display the impedance value calculated by the processing unit.

2. The impedance detection apparatus according to claim 1, wherein the first resistor is formed by connecting two bridge arm resistors having the same resistance in parallel, the voltage sampling unit further comprises a second resistor, the second resistor is connected between the contact access point and the jack end ground wire contact, and the resistance of the second resistor is the same as the resistance of the bridge arm resistor.

3. The impedance detection apparatus according to claim 1, wherein the processing unit is further configured to determine whether the calculated impedance value is within a corresponding standard range and output a determination result signal, wherein if yes, then the determination result signal is a normal signal indicating a normal impedance value, and if no, then the determination result signal is an abnormal signal indicating an abnormal impedance value; and the apparatus further comprises a prompting unit configured to prompt the abnormal impedance value according to at least the abnormal signal.

4. The impedance detection apparatus according to claim 1, wherein the earphone jack unit comprises a 3.5 mm earphone jack corresponding to a 3.5 mm earphone plug and a USB earphone jack corresponding to a USB earphone plug.

5. The impedance detection apparatus according to claim 1, wherein the voltage sampling unit further comprises an in-phase proportional amplifier circuit, the contact access point is connected to a voltage input terminal of the in-phase proportional amplifier circuit, and an output terminal of the in-phase proportional amplifier circuit is connected to a voltage input terminal of the processing unit.

6. The impedance detection apparatus according to claim 5, wherein the first resistor is formed by connecting two bridge arm resistors having the same resistance in parallel, the voltage sampling unit further comprises a second resistor, the second resistor is connected between the contact access point and the jack end ground wire contact, and the resistance of the second resistor is the same as the resistance of the bridge arm resistor.

7. The impedance detection apparatus according to claim 1, wherein each of the selection switches is a relay contact, and the apparatus is configured to control a switching state of the relay contact by the processing unit.

8. The impedance detection apparatus according to claim 7, wherein the selection switches are all normally open relay contacts.

9. The impedance detection apparatus according to claim 8, wherein a normally closed relay contact corresponding to each normally open relay contact is connected between the corresponding connection contact and the jack end ground wire contact.

10. The impedance detection apparatus according to claim 1, wherein the display unit comprises a latch and digital tubes, and an IO pin of the processing unit for outputting a segment code control signal is connected to a corresponding segment code pin of the corresponding digital tube via the latch.

11. The impedance detection apparatus according to claim 10, wherein the display unit is a display unit of two or more bits, and the display unit adopts a dynamic display structure, wherein the same segment code pins of all the digital tubes are connected together, and an IO pin of the processing unit for outputting a bit gating signal is connected to a gating pin of the corresponding digital tube.

* * * * *